May 12, 1970 YASUTOMO MIYAKE ET AL 3,512,107

TRANSISTORIZED CRYSTAL OVERTONE OSCILLATOR

Filed Feb. 9, 1968 2 Sheets-Sheet 1

INVENTORS
YASUTOMO MIYAKE AND
TOSHIO SHINADA

BY Linton and Linton
ATTORNEYS

TRANSISTORIZED CRYSTAL OVERTONE OSCILLATOR

Filed Feb. 9, 1968 2 Sheets-Sheet 2

INVENTORS
YASUTOMO MIYAKE AND
TOSHIO SHINADA
BY Linton and Linton
ATTORNEYS

United States Patent Office 3,512,107

Patented May 12, 1970

3,512,107

TRANSISTORIZED CRYSTAL OVERTONE OSCILLATOR

Yasutomo Miyake, Yokohama, and Toshio Shinada, Tokyo, Japan, assignors to Kabushiki-Kaisha Kinsekisha-Kenkyujo, Tokyo, Japan, a corporation of Japan

Filed Feb. 9, 1968, Ser. No. 704,417

Claims priority, application Japan, Feb. 11, 1967, 42/8,526; Apr. 3, 1967, 42/21,384

Int. Cl. H03b *5/36*

U.S. Cl. 331—116 2 Claims

ABSTRACT OF THE DISCLOSURE

The present transistorized crystal overtone oscillator includes a transistor, a piezoelectric crystal unit connected between the base and the collector of said transistor, a unit including a capacitance and a resistance connected in parallel and connected in series between said transistor base and the ground, and a substantially pure resistance connected between said transistor collector and the ground for generating overtone oscillation with fundamental frequencies and with overtones of high orders which can be selectively produced.

The present invention relates to small-sized high frequency oscillators which oscillate with overtones.

It is an object of the present invention to provide high frequency oscillators with which oscillation with fundamental frequencies and with overtones of higher orders can be selectively produced, and also which oscillate easily.

It is an other object of the present invention to provide high frequency oscillators with which oscillations with fundamental frequencies or with overtones of higher orders can be selectively produced exclusively by means of changing the value of resistances in the oscillator circuit.

It is accordingly still another object of the present invention to provide small-sized high frequency oscillators and also to provide means for reducing high frequency oscillators into integral circuits easily.

The features and advantages of the present invention will become apparent by reference to the following description taken in connection with the accompanying drawings, in which.

Figures 6, 7, 8, 9, 10:
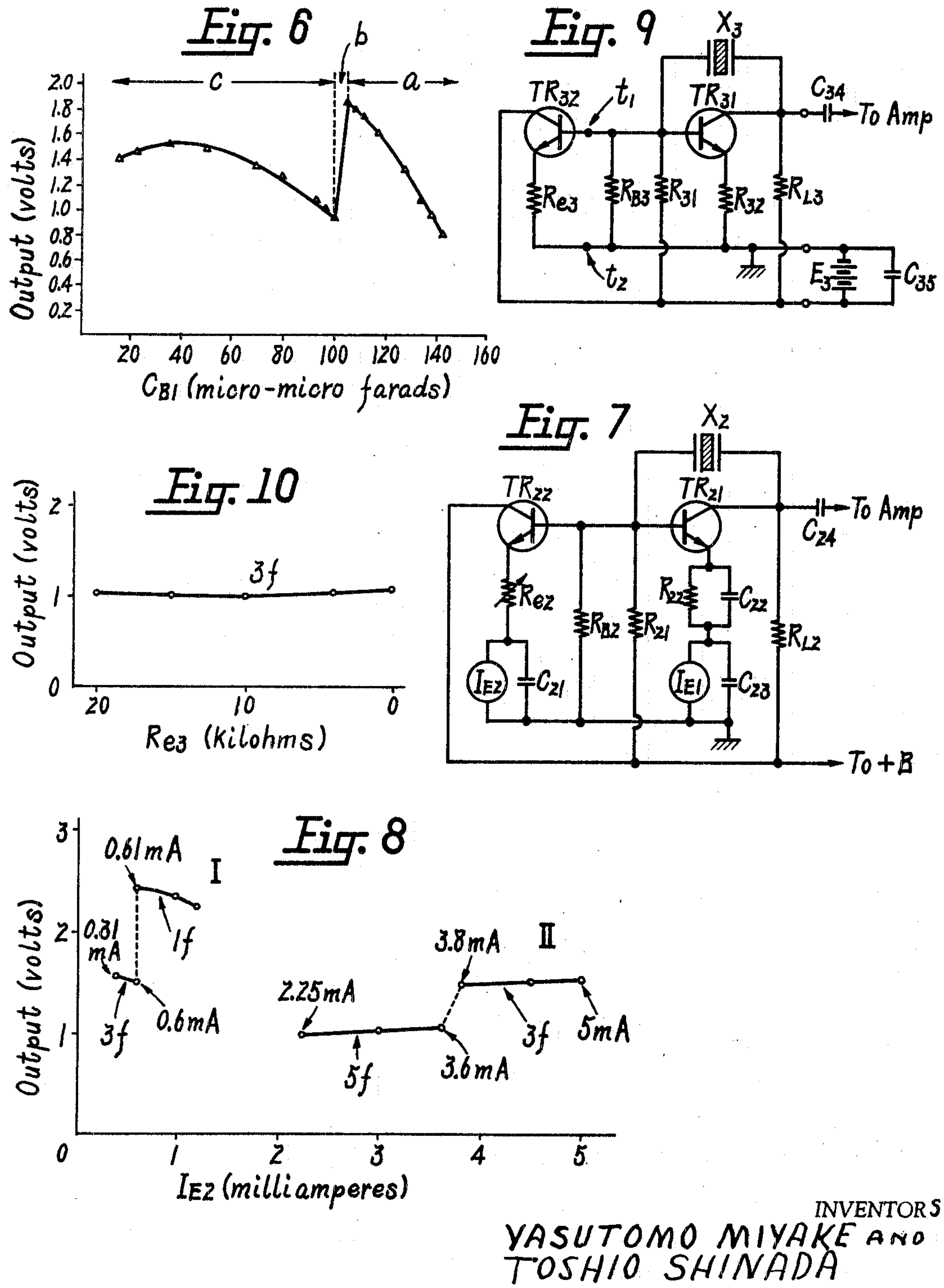
FIG. 6 shows for the oscillator of FIG. 5 the characteristic curves obtained experimentally of the output against the capacitance connected to the transistor base.
FIG. 7 is a circuit diagram of the second embodiment according to the present invention.
FIG. 8 shows for the oscillator of FIG. 7 the characteristic curves obtained experimentally of the output against the second transistor emitter current.
FIG. 9 is a circuit diagram of the third embodiment according to the present invention.

And, FIG. 10 shows for the oscillator of FIG. 9 the characteristic curve obtained experimentally of the output against the resistance connected to the second transistor emitter.

A transistorized crystal overtone oscillator according to the present invention comprises a transistor, a piezoelectric crystal unit connected between the base and the collector of said transistor, a unit including a capacitance and a resistance connected in parallel and connected in series between said transistor base and the ground, and a substantially pure resistance connected between said transistor collector and the ground for generating overtone oscillation.

Figure 1:
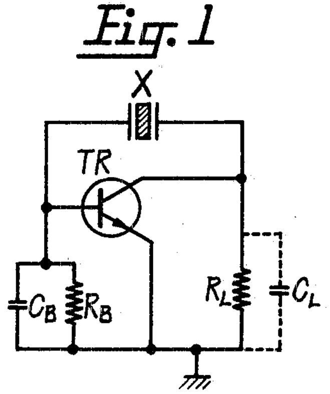
FIG. 1 is a fundamental circuit diagram of the transistorized crystal overtone oscillator of the present invention.

An oscillator according to the present invention has a fundamental circuit as shown in FIG. 1. And, for example, the input resistance of this oscillator circuit against change in value of capacitance $C_B$ which is connected to said transistor base is calculated as shown by the curves in FIG. 2 at oscillation frequencies of 5 mHz. and 15 mHz. and at numerical values of the constants in this circuit as follows:

the transistor current amplification constant $\alpha_0=0.98$
the transistor cut off frequency $f\alpha=200$ mHz.
the transistor collector capacitance $C_c=1$ micro-micro-farad
the transistor collector resistance $r_c=1$ megohm
$R_L=1$ kilohm and $R_B=5$ kilohms.

Figure 2:
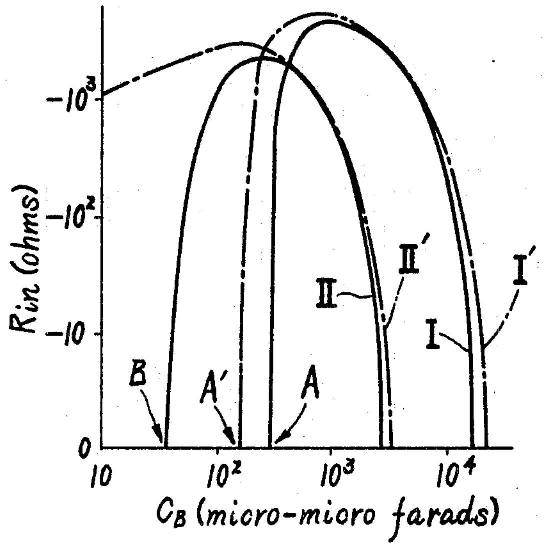
FIG. 2 shows for the oscillator of FIG. 1 examples of characteristic curves of the input resistance against the capacitance which are connected between the base and emitter of the transistor.

In FIG. 2, curve I corresponds to a fundamental oscillation frequency $f=5$ mHz., resistance $R_L$ being pure resistance, that is, an imaginary capacitance $C_L=0$ which is connected imaginarily in parallel with said $R_L$. Curve I′ corresponds to a fundamental oscillation $f=5$ mHz. and an imaginary capacitance $C_L=10$ micro-microfarads. Curve II corresponds to $f=15$ mHz. and $C_L=0$. And, curve II′ corresponds to $f=15$ mHz. and $C_L=10$ micro-microfarads. Each curve in FIG. 2 is shown exclusively within the range in which oscillation is produced, that is at $R_{in}<0$.

When taking the fundamental oscillation frequency at 5 mHz., $C_L$ at 0 and $C_B$ at $<$A (A is a point at which curve I and the abscissa cross), the oscillation of 5 mHz. stops, and within a range B$<C_B<$A (B is a point at which curve II and the abscissa cross) oscillation of 15 mHz., that is oscillation with third order overtone may be producde. Further, when taking $C_B$ at $<$B, an oscillation with overtone of fifth order may be produced. For such overtone oscillations being possible, a capacitance which stops oscillations of the order lower than the overtone frequency desired must be present. In case when $C_L=0$, that is, $R_L$ is a pure resistance, such a capacitance $C_B$ can be always obtained. On the other hand, as with the cases of curves I′ or II′, in cases when $R_L$ is not a pure resistance and an imaginary capacitance $C_L=10$ micro-microfarads for example, oscillation of 5 mHz. can be stopped at A′, and, on the contrary, oscillation of 15 mHz. cannot be stopped. Thus, it was found by us that, with a circuit of FIG. 1, the larger is the value of the capacitance between the transistor collector and the ground, the more difficult is to stop oscillations of higher orders. Accordingly, it is necessary to have the resistance between the transistor collector and the ground to be a substantially pure resistance.

When taking the capacitance $C_B$ at $C_{BS}$ with which oscillation stops at aforesaid A, A′ or B, and taking $f\alpha/f$ at $>20$, and $C_L$ at 0, this $C_{BS}$ can be calculated from a formula as follows:

$$X_{BS}=\frac{1}{2}\pi fC_{BS}\cong r_b\beta_0(f/f\alpha)(1+2\pi f\alpha C_C R_L)$$

where, $X_{BS}$ is the reactance with which oscillation stops, $r_b$ is the transistor base resistance, $\beta_0$ is the emitter ground current amplification constant, $f\alpha$ is the cut off frequency of the current amplification constant $\alpha$, $C_C$ is the collector capacitance, $R_L$ is the load resistance connected between the transistor collector and the ground, and $f$ is the oscillation frequency of the order one order lower than the desired overtone frequency. And, when taking the value of $C_{BS}$ at a value smaller than the value calculated from the above formula, oscillation of $f$ stops and oscillation with overtone becomes possible to be produced.

Figure 3:
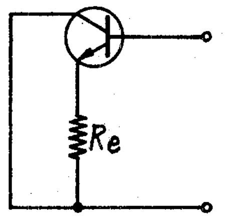
FIG. 3 is a fundamental circuit diagram of an emitter-follower type transistor oscillator circuit of the prior art.
Figure 4:
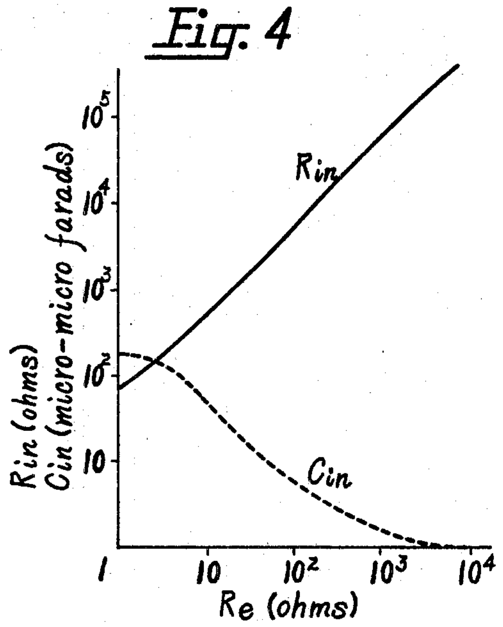
FIG. 4 shows for the circuit of FIG. 3 an example of the input resistance and the input capacitance respectively against the transistor emitter resistance.

As mentioned above, an oscillator of the present invention produces overtone by using capacitances and resistances exclusively in the oscillation circuit, and without using inductances. However, emitter-follower type transistor oscillators, as shown in FIG. 3, in which also capacitances and resistances exclusively are used in a transistor circuit have been known. And, with such an emitter-follower type circuit of the prior art in which the transistor emitter is loaded with a resistance, input capacitance $C_{in}$ and input load resistance $R_{in}$ changes by change in value of the transistor emitter resistance $R_e$. And, from the calculation of the maximum value of input load resistance $R_{in}$ by taking the current amplification constant $\alpha_0$ at 0.98, the cut off frequency $f\alpha$ at 200 mHz., and the transistor collector capacitance $C_C$ at 2 micro-microfarads, said $R_{in}$ is calculated at about −2.0 kilohms with said emitter-follower type oscillation circuit of the prior art, and about −5.0 kilohms with an oscillation circuit according to the present invention. Accordingly, it is easy to reach the conclusion that an oscillation circuit according to the present invention is appreciably easier to oscillate than an emitter follower type oscillation circuit of the prior art.

Figure 5:
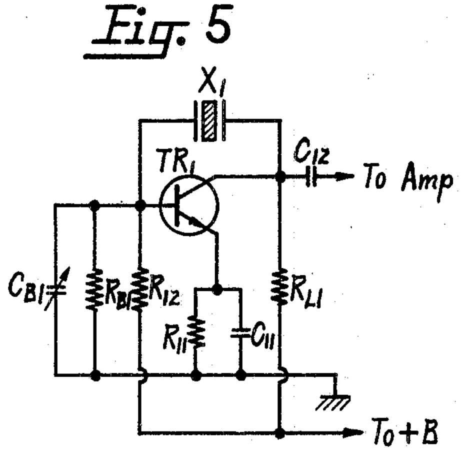
FIG. 5 is a circuit diagram of the first embodiment according to the present invention.

In FIG. 5, the first embodiment of the present invention is shown in which, numerical values of the constants are as follows:

$C_{11}$=0.05 micro-microfarads
$C_{12}$=2 micro-microfarads
$R_{B1}$=100 kilohms
$R_{11}$=900 ohms
$R_{12}$=330 kilohms
$R_{L1}$=1.2 kilohms
B source voltage=12 volts and the fundamental oscillation frequency of crystal $X_1$ is 6 mHz. Characteristic curves shown in FIG. 6 were obtained by experiment for the circuit of FIG. 5 by changing the value of $C_{B1}$. Values of output were measured through an amplifier. At the range *a*, an oscillation of 6 mHz. is produced. At the range *b*, wave form is distorted on account of coexistence of oscillations of 6 mHz. and 18 mHz. And, at the range *c*, an oscillation of 18 mHz. is produced.

In FIG. 7, the second embodiment of the present invention is shown. This embodiment corresponds to a circuit of the fundamental circuit of the present invention in which $C_B$ is substituted by input capacitance $C_{in}$ of an emitter-follower type oscillation circuit shown in FIG. 3. The circuit of the transistor $TR_{22}$ is composed of an emitter-follower circuit.

In FIG. 8, results of an experiment using a circuit of FIG. 7 is shown, in which, types and numerical values of the constants are as follows: $TR_{21}$ and $TR_{22}$ are respectively a transistor 2SC287, $R_{12}$=1 kilohm, and the fundamental oscillation frequency of crystal $X_2$ is 10 mHz. Curve I corresponds to the fundamental oscillation and the third order overtone at the emitter current of $TR_{21}$, $I_{E1}$=1 milliampere. The values of emitter current of $TR_{22}$ which changes by change of value of $R_{E2}$ is shown at $I_{E2}$. As shown by curve I, an overtone of third order is produced at the range $I_{E2}$=0.31∼0.6 milliampere, and the fundamental oscillation is produced when $I_{E2}$ takes a value over 0.61 milliampere. Curve II corresponds to the third and fifth order overtone oscillations at $I_{E1}$=5 milliamperes. At the range $I_{E2}$=2.25∼3.6 milliamperes, the fifth order overtone is produced, and at the range $I_{E2}$=3.8∼5 milliamperes, the third order overtone is produced. The values of output were measured through an amplifier.

In FIG. 9, the third embodiment of the present invention is shown. This circuit corresponds to the circuit of the aforementioned second embodiment of the present invention, in which, the value of resistance $R_{22}$ which is connected to the emitter of $TR_{21}$ is taken as small as possible unless the stability of the oscillation is not to be influenced. Such a circuit as is shown in FIG. 9 oscillates without a capacitance connected to the emitter of the first transistor and which is connected in parallel with a resistance.

In FIG. 10, results of an experiment using a circuit of FIG. 9 is shown, in which, types and numerical values of the constants are as follows: $TR_{31}$ and $TR_{32}$ are respectively a transistor 2SC287, $R_{L3}$=1.8 kilohms, $R_{32}$=100 ohms, the fundamental oscillation frequency of crystal $X_3$ is 10 mHz., and the voltage of source $E_3$ is 12 volts. At a wide range over $R_{e3}$=20 ohms∼20 kilohms, an oscillation of third order overtone is produced, and the output is constant at the emitter current of $TR_{31}$ 6 milliamperes. Values of the output were measured through an amplifier.

In the circuit of FIG. 9, if coupling condenser $C_{34}$ and by-pass condenser $C_{35}$ for the electric source are put out of the circuit, the substantial portion of the oscillation circuit will be composed of only two transistors and several resistors. Accordingly, an oscillator will be made extremely small and also it can be reduced to an integral circuit.

An oscillator according to the aforesaid third embodiment produces a fundamental oscillation. However, if overtones of third or fifth order are desired, input capacitance of the transistor $TR_{31}$ seen from the collector terminal $t_1$ of transistor $TR_{32}$ and the ground terminal $t_2$ may be regulated to a value, which value can be calculated from the aforesaid formula for the oscillation of overtones of aforesaid desired respective order.

Further, it will be apparent to those skilled in the art that, by substitution of $R_{e2}$, $R_{e3}$, $R_{L2}$, or $R_{L3}$ in the second or third embodiment of the present invention by resistive elements having large temperature characteristics such as thermisters, stabilization of oscillation frequency over a wide temperature range and with a small-sized oscillation circuit such as may be composed by an integral circuit can be achieved easily.

As mentioned above, according to the present invention, overtone oscillations can be produced without using inductances in an oscillation circuit, and overtone oscillators which oscillate appreciably more easily than emitter-follower type oscillators of the prior art can be provided. And also, according to the present invention, oscillators with which oscillation frequency change from fundamental frequency to overtones of higher orders, or from overtone oscillation of higher orders to the fundamental frequency can be controlled only by means of changing the value of resistances of the circuit component can be provided. Thus, according to the present invention, reduction of oscillators into small-sized ones, particularly into integral circuits, or stable oscillation against temperature change by means of integral circuit oscillators can be achieved.

Having thus described our invention what is claimed for Letters Patent is:

1. A transistorized crystal overtone oscillator which comprises a transistor, a piezoelectric crystal unit connected between the base and the collector of said transistor, a substantially pure resistance connected between said transistor collector and the ground, the emitter of said transistor being connected substantially to the ground with respect to high frequency, a resistance connected between said transistor base and the ground, a collector terminal and a ground terminal of an emitter-follower type transistor circuit connected in parallel to said resistance connected between said transistor base and the ground, and the bases of said transistor and said emitter-follower type transistor circuit being connected to each other.

2. A transistorized crystal overtone oscillator which comprises a transistor, a piezoelectric crystal unit connected between the base and the collector of said transistor, a substantially pure resistance connected between said transistor collector and the ground, the emitter of said transistor being connected to the ground through a resistance of as small a value as said oscillator may oscillate, a resistance connected between said transistor base and the ground, a collector terminal and a ground terminal of an emitter-follower type transistor circuit connected in parallel to said resistance connected between said transistor base and the ground, and the bases of said transistor and said emitter-follower type transistor circuit being connected to each other.

References Cited

UNITED STATES PATENTS

| | | | |
|---|---|---|---|
| 3,110,863 | 11/1963 | Weidknecht et al. | 331—116 X |
| 3,260,960 | 7/1966 | Bangert | 331—177 X |
| 3,416,036 | 12/1968 | Ho | 331—116 X |

ROY LAKE, Primary Examiner

S. H. GRIMM, Assistant Examiner

U.S. Cl. X.R.

331—177